(12) United States Patent
Hagita et al.

(10) Patent No.: US 11,950,366 B2
(45) Date of Patent: Apr. 2, 2024

(54) ELECTRONIC COMPONENT MOUNTING STRUCTURE

(71) Applicant: TDK CORPORATION, Tokyo (JP)

(72) Inventors: Kazuhiro Hagita, Tokyo (JP); Yoshiaki Ishikawa, Tokyo (JP); Masaharu Moritsugu, Tokyo (JP)

(73) Assignee: TDK CORPORATION, Tokyo (JP)

( * ) Notice: Subject to any disclaimer, the term of this patent is extended or adjusted under 35 U.S.C. 154(b) by 266 days.

(21) Appl. No.: 17/635,968

(22) PCT Filed: Sep. 3, 2020

(86) PCT No.: PCT/JP2020/033437
§ 371 (c)(1),
(2) Date: Feb. 16, 2022

(87) PCT Pub. No.: WO2021/045155
PCT Pub. Date: Mar. 11, 2021

(65) Prior Publication Data
US 2022/0295640 A1 Sep. 15, 2022

(30) Foreign Application Priority Data

Sep. 4, 2019 (JP) .................................. 2019-161449

(51) Int. Cl.
*H05K 1/18* (2006.01)
*H05K 1/11* (2006.01)
(52) U.S. Cl.
CPC .............. *H05K 1/181* (2013.01); *H05K 1/112* (2013.01); *H05K 2201/10515* (2013.01)
(58) Field of Classification Search
CPC .......... H05K 1/11; H05K 1/111; H05K 1/112; H05K 1/18; H05K 1/181–187;

(Continued)

(56) References Cited

U.S. PATENT DOCUMENTS

| 7,629,720 | B2 * | 12/2009 | Koumura | ............... | H02K 11/05 |
| | | | | | 310/88 |
| 2005/0082930 | A1 * | 4/2005 | Kashihara | .............. | H02K 11/05 |
| | | | | | 310/179 |

(Continued)

FOREIGN PATENT DOCUMENTS

JP 2007-166413 A 6/2007

OTHER PUBLICATIONS

Mar. 8, 2022 International Preliminary Report on Patentability issued in Patent Application No. PCT/JP2020/033437.

*Primary Examiner* — Tuan T Dinh
(74) *Attorney, Agent, or Firm* — Oliff PLC (57) ABSTRACT

An electronic component mounting structure is an electronic component mounting structure in which an electronic component group is mounted on a substrate, and a pattern constituting a part of a current path between the inflow port and the outflow port, the electronic component group includes a plurality of electronic components connected between the inflow port and the outflow port, each of the electronic components has a current inflow terminal electrically connected to the inflow port and a current outflow terminal electrically connected to the outflow port, and one of a first spatial distance group and a second spatial distance group has equal spatial distances within the one spatial distance group, and the first spatial distance group includes spatial distances between the inflow port and the inflow terminals, and the second spatial distance group includes spatial distances between the outflow port and the outflow terminals.

7 Claims, 8 Drawing Sheets

(58) Field of Classification Search
CPC ...... H05K 1/02; H05K 1/0206; H05K 1/0265; H05K 2201/0939; H05K 2201/10515; H05K 2201/10166; H01L 25/07; H01L 25/18
USPC .................. 361/760, 764, 784, 770, 792–795
See application file for complete search history.

(56) References Cited

U.S. PATENT DOCUMENTS

| | | | | |
|---|---|---|---|---|
| 2005/0218502 | A1* | 10/2005 | Sunohara | H01L 23/50 257/E23.079 |
| 2012/0250323 | A1* | 10/2012 | Velu | F21V 29/00 257/E33.056 |
| 2017/0175990 | A1* | 6/2017 | Patel | F21V 3/049 |
| 2018/0203051 | A1* | 7/2018 | Generazio | G01R 29/0892 |

* cited by examiner

ELECTRONIC COMPONENT MOUNTING STRUCTURE

TECHNICAL FIELD

The present disclosure relates to an electronic component mounting structure.

BACKGROUND ART

Conventionally, as an electronic component mounting structure, a structure shown in Patent Literature 1 has been known. This electronic component mounting structure is configured by arranging a plurality of electronic components on a substrate. The plurality of electronic components is arranged to line up in a straight line.

CITATION LIST

Patent Literature

Patent Literature 1: Japanese Unexamined Patent Publication No. 2004-166413

SUMMARY OF INVENTION

Technical Problem

Here, when the plurality of electronic components is arranged in a straight line, depending on the positional relationship with a current inflow port, a current outflow port, or a heat radiating structure, thermal resistance, DC resistance, impedance, and wiring inductance may be uneven between electronic components. In this way, component heat generation for each electronic component and a current value originally desired to be uniform may become non-uniform. Therefore, it has been required to equalize the thermal resistance, the DC resistance, the impedance, and the wiring inductance, which are factors that cause the component heat generation for each electronic component and the current value to be non-uniform among the plurality of electronic components.

An object of the present disclosure is to provide an electronic component mounting structure capable of attempting equalization of component heat generation for each electronic component and a current value among a plurality of electronic components.

Solution to Problem

An electronic component mounting structure according to an aspect of the present disclosure is an electronic component mounting structure in which an electronic component group is mounted on a substrate, in which the substrate has a current inflow port and a current outflow port, and a pattern constituting a part of a current path between the inflow port and the outflow port, the electronic component group includes a plurality of electronic components connected between the inflow port and the outflow port, each of the electronic components has a current inflow terminal electrically connected to the inflow port and a current outflow terminal electrically connected to the outflow port, and one of a first spatial distance group and a second spatial distance group has equal spatial distances within the one spatial distance group, and the first spatial distance group includes spatial distances between the inflow port and the inflow terminals, and the second spatial distance group includes spatial distances between the outflow port and the outflow terminals.

In the electronic component mounting structure according to the aspect of the present disclosure, one of a first spatial distance group and a second spatial distance group has equal spatial distances within the one spatial distance group. The first spatial distance group includes spatial distances between the inflow port and the inflow terminals. The second spatial distance group includes spatial distances between the outflow port and the outflow terminals. With such a configuration, it is possible to equalize a spatial distance of the inflow terminal of each electronic component with respect to the inflow port, or a spatial distance of the outflow terminal of each electronic component with respect to the outflow port. In this case, among the plurality of electronic components, it is possible to attempt equalization of a wiring impedance between the inflow port and the inflow terminal, or attempt equalization of a wiring impedance between the outflow port and the inflow terminal From the above description, it is possible to attempt equalization of component heat generation for each electronic component and a current value among the plurality of electronic components.

The electronic component group may include the plurality of electronic components having the same standard. Since the electronic components mutually have the same standard, the effect of the equalization of the component heat generation for each electronic component and the current value becomes more remarkable by adopting the above configuration.

One of a first thermal resistance group and a second thermal resistance group has equal thermal resistance within the one thermal resistance group. The first thermal resistance group includes thermal resistances between the inflow port and the inflow terminals. The second thermal resistance group includes thermal resistances between the outflow port and the outflow terminals. In this case, it is possible to attempt equalization of the thermal resistance among the plurality of electronic components.

One of a first DC resistance group and a second DC resistance group has equal DC resistances within the one DC resistance group. The first DC resistance group includes DC resistances of patterns between the inflow port and the inflow terminals. The second DC resistance group includes DC resistances of patterns between the outflow port and the outflow terminals. In this case, it is possible to attempt equalization of the DC resistance among the plurality of electronic components.

One of a first impedance group and a second impedance group has equal impedances within the one impedance group. The first impedance group includes impedances of patterns between the inflow port and the inflow terminals. The second impedance group includes impedances of patterns between the outflow port and the outflow terminals. In this case, it is possible to attempt equalization of the impedance among the plurality of electronic components.

An electronic component mounting structure according to an aspect of the present disclosure is an electronic component mounting structure in which an electronic component group is mounted on a substrate, in which the substrate has a current inflow port and a current outflow port, and a pattern constituting a part of a current path between the inflow port and the outflow port, the electronic component group includes a plurality of electronic components connected between the inflow port and the outflow port, each of the electronic components has a current inflow terminal electrically connected to the inflow port and a current outflow terminal electrically connected to the outflow port, and the plurality of electronic components is disposed to line up in a circumferential direction with reference to one of the inflow port and the outflow port.

In the electronic component mounting structure according to the aspect of the present disclosure, the plurality of electronic components is disposed to line up in the circumferential direction with reference to one of the inflow port and the outflow port. With such a configuration, it is possible to equalize a spatial distance of each electronic component with respect to the inflow port, or a spatial distance of each electronic component with respect to the outflow port. In this case, among the plurality of electronic components, it is possible to attempt equalization of a wiring impedance between the inflow port and the electronic component, or attempt equalization of a wiring impedance between the outflow port and the electronic component. From the above description, it is possible to attempt the equalization of the component heat generation for each electronic component and the current value among the plurality of electronic components.

The pattern may have a first pattern on an inner peripheral side electrically connected to one of the inflow port and the outflow port, and a second pattern on an outer peripheral side electrically connected to the other one of the inflow port and the outflow port, a stacked pattern stacked in a stacking direction with respect to the second pattern may be provided, and a first through-hole conductor electrically connecting the second pattern and the stacked pattern may be formed at a position close to the other one of the inflow port and the outflow port, and a second through-hole conductor may be formed at a position separated from the first through-hole conductor in a circumferential direction. In this case, the current from the electronic component to the other one of the inflow port and the outflow port passes through not only a current path of the second pattern, but also a current path passing through the second through-hole conductor, the stacked pattern, and the first through-hole conductor. In this case, for the other one of the inflow port and the outflow port, it is possible to equalize the component heat generation for each electronic component and the current value among the electronic components.

Advantageous Effects of Invention

According to the present disclosure, it is possible to provide an electronic component mounting structure capable of attempting equalization of component heat generation for each electronic component and a current value among a plurality of electronic components.

DESCRIPTION OF EMBODIMENTS

Figure 1:
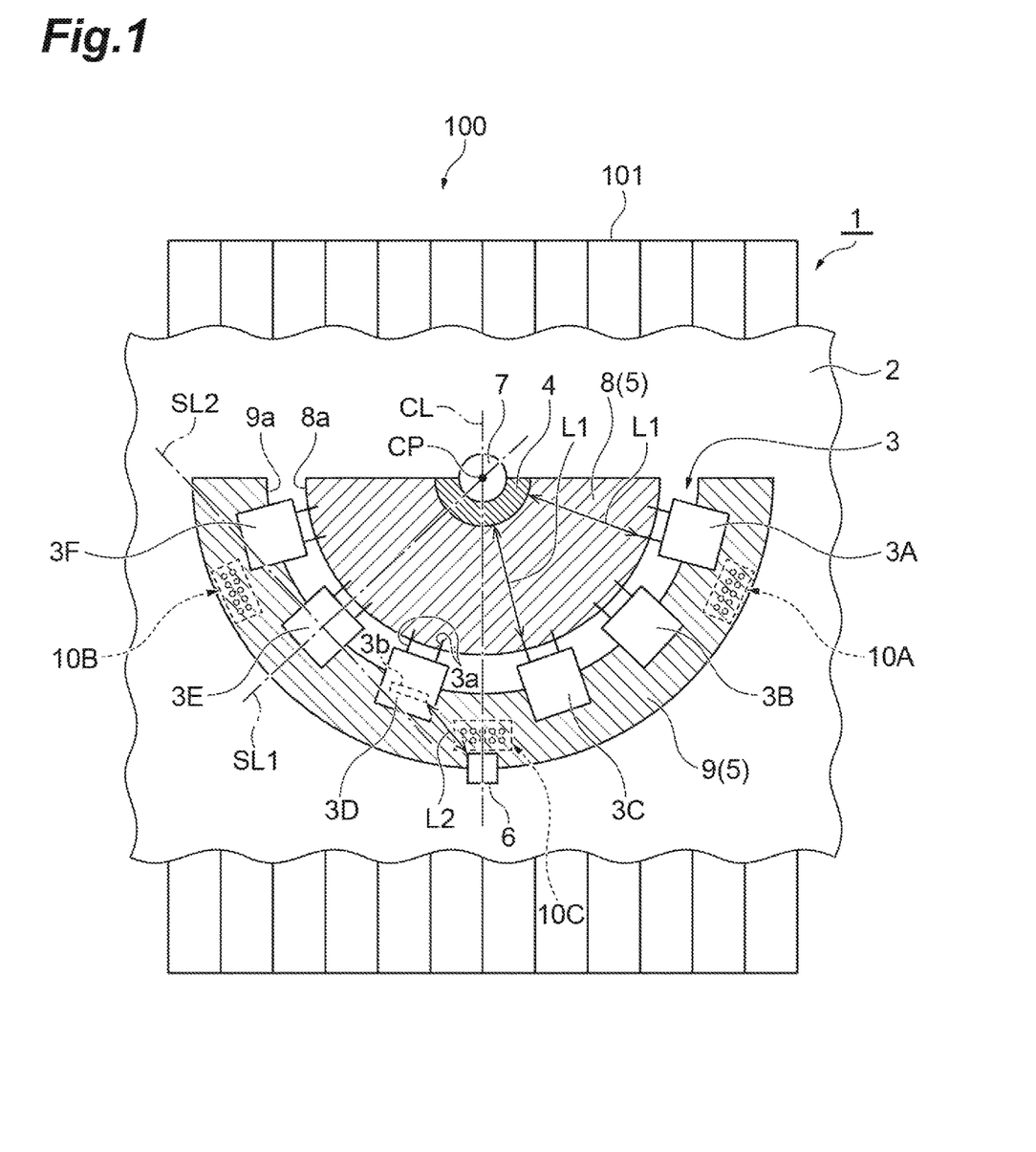
FIG. 1 is a plan view illustrating an electronic component mounting structure according to an embodiment of the present disclosure.
Figure 2:
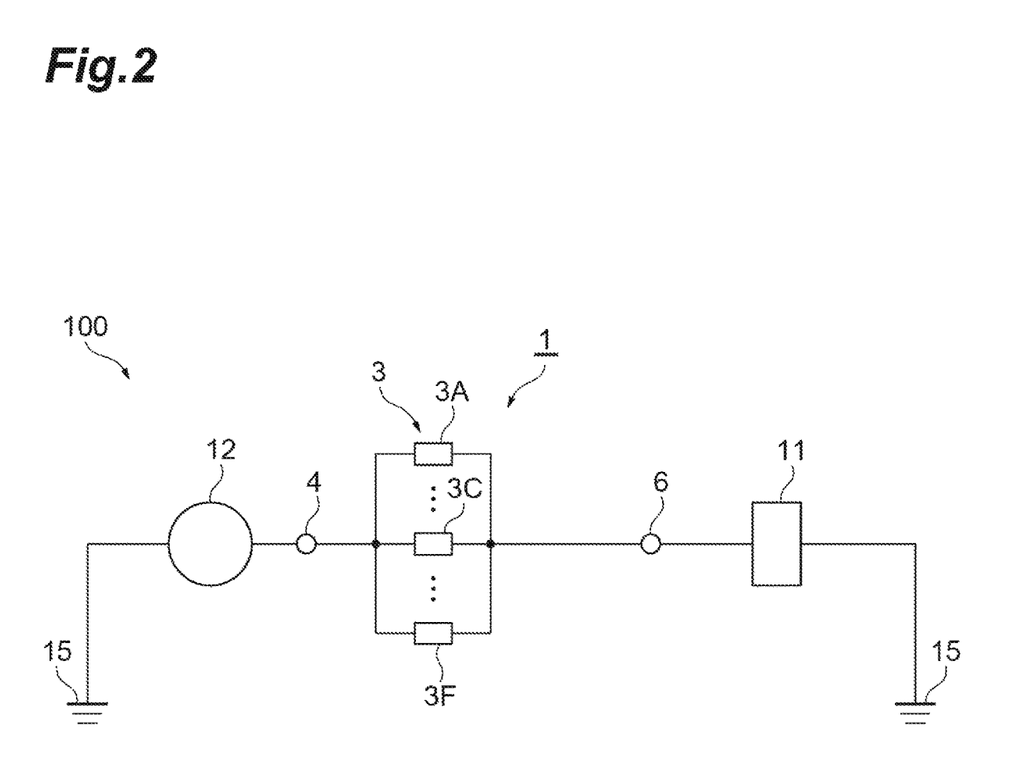
FIG. 2 is a circuit diagram of the electronic component mounting structure 1 according to the embodiment of the present disclosure.

An electronic component mounting structure 1 according to an embodiment of the present disclosure will be described with reference to FIGS. 1 and 2. FIG. 1 is a plan view illustrating the electronic component mounting structure 1 according to the present embodiment of the present disclosure. FIG. 2 is a circuit diagram of the electronic component mounting structure 1 according to the embodiment of the present disclosure.

As illustrated in FIG. 1, the electronic component mounting structure 1 is a mounting structure in which an electronic component group 3 is mounted on a substrate 2. That is, the electronic component mounting structure 1 includes the substrate 2 and the electronic component group 3 mounted on the substrate 2. The electronic component mounting structure 1 is a structure applied to a predetermined electronic device 100. Examples of the electronic device 100 include a power supply device, a charging device, an inverter device, etc. The electronic device 100 may include the electronic component mounting structure 1 and a heat radiating structure 101 that cools the electronic component group 3. The heat radiating structure 101 is provided on a main surface on an opposite side from the electronic component group 3 with respect to the substrate 2. As the heat radiating structure 101, for example, a base plate including heat radiating fins, etc. is adopted.

The substrate 2 is a plate-shaped member for mounting various electronic components, etc. When the electronic component is a diode having an anode terminal as a current inflow terminal and a cathode terminal as a current output terminal, the substrate 2 has an anode connection portion 4 which is a current inflow port, a cathode connection portion 6 which is a current outflow port, and a pattern 5 that forms a part of a current path between the anode connection portion 4 and the cathode connection portion 6. Further, the substrate 2 includes a ground terminal 7 which is grounded to the ground and is responsible for returning a current to an electromotive force portion 12 (outflow of the current depending on the direction of the current).

As illustrated in FIG. 2, the anode connection portion 4 is connected to the electromotive force portion 12, and is a portion where the current from the electromotive force portion 12 flows in. Examples of the electromotive force portion 12 include a battery, a transformer of a switching DC/DC converter, etc. The anode connection portion 4 is a portion serving as a relay point for connecting the electromotive force portion 12 and the electronic component group 3. The electromotive force portion 12 is grounded with respect to the ground 15 on the opposite side from the anode connection portion 4. The cathode connection portion 6 is connected to an electrical device 11. Note that the electrical device 11 here refers to a device that exhibits a predetermined function by a current. The electrical device 11 is a part of components of the electronic device 100. Examples of the electrical device 11 include an engine control unit (ECU), accessory equipment, etc. However, the electrical device 11 is not limited thereto.

The cathode connection portion 6 causes the current flowing from the electromotive force portion 12 through the anode connection portion 4 to flow out, and supplies the current to the electrical device 11. The cathode connection portion 6 is a portion serving as a relay point for connecting the electronic component group 3 and the electrical device 11. The electrical device 11 is grounded with respect to the ground 15 on the opposite side from the cathode connection portion 6.

Returning to FIG. 1, the anode connection portion 4 is an electrode formed to surround the ground terminal 7, and has an arcuate fan shape. Note that the anode connection portion 4 extends at an angle of 180° with respect to a center point of the ground terminal 7. Note that a center line CL is set with respect to a center position (position at 90°) in a circumferential direction of the anode connection portion 4. The center line CL passes through the center point CP of the ground terminal 7. In the following description, the center point CP is used as a reference, a direction away from the center point CP is defined as a "radial direction", and a direction around the center point CP is defined as the "circumferential direction". The cathode connection portion 6 is an electrode formed at a position separated from the ground terminal 7 and the anode connection portion 4 in the radial direction. The cathode connection portion 6 is formed on the center line CL.

The pattern 5 includes a conductor pattern formed on a surface of the substrate 2. The pattern 5 has a first pattern 8 (anode pattern) and a second pattern 9 (cathode pattern). The first pattern 8 is a pattern on an inner peripheral side electrically connected to the anode connection portion 4. The second pattern 9 is a pattern on an outer peripheral side electrically connected to the cathode connection portion 6. In the present embodiment, the first pattern 8 has an arcuate fan shape that extends from the anode connection portion 4 to further expand to the outer peripheral side. The second pattern 9 has an arcuate band shape formed to surround the first pattern 8 at a position separated from the first pattern 8 on the outer peripheral side. The second pattern 9 is disposed so that the center position (position at 90°) in the circumferential direction coincides with the center line CL. Note that a shape of the pattern 5 is not limited to the shape.

An outer peripheral edge portion 8a of the first pattern 8 and an inner peripheral edge portion 9a of the second pattern 9 are disposed to face each other in a circumferentially separated state. As described above, a margin portion 31 is formed between the outer peripheral edge portion 8a of the first pattern 8 and the inner peripheral edge portion 9a of the second pattern 9. The first pattern 8 and the second pattern 9 are not electrically connected to each other by being separated from each other by the margin portion 31.

The electronic component group 3 is connected between the anode connection portion 4 and the cathode connection portion 6. The electronic component group 3 is connected to the anode connection portion 4 via the first pattern 8. The electronic component group 3 is connected to the cathode connection portion 6 via the second pattern 9. In this way, the first pattern 8, the electronic component group 3, and the second pattern 9 are connected in series between the anode connection portion 4 and the cathode connection portion 6. As a result, the electronic component group 3 is connected in series between the anode connection portion 4 and the cathode connection portion 6. Further, in the present embodiment, the electronic component group 3 includes a plurality of electronic components 3A to 3F having the same standard. A plurality of electronic component groups may be present. In that case, a plurality of electronic components having the same standard is included in each of the electronic component groups. For example, in an example of FIG. 1, three electronic components may have the same standard, and the other three electronic components may have the same standard (standard different from the previous three standards). Further, electronic components having different standards may be arranged for an electronic component group including a plurality of electronic components having the same standard. For example, in the example of FIG. 1, only one (or a plurality) of the six electronic components may have a different standard, and the remaining electronic components may have the same standard. As the electronic components 3A to 3F, any electronic component that can be mounted on the substrate 2 may be adopted. For example, examples of the electronic components 3A to 3F include a semiconductor, an inductor, a capacitor, a resistor, a fuse, etc. Further, examples of the semiconductor include a diode as a rectifying element of a switching DC/DC converter, a FET (used in synchronous rectification), etc. Note that an example of the electronic component mounting structure when a diode is used will be described later. A state in which a "plurality of electronic components" mutually has the "same standard" refers to a state in which a function as at least an electronic component is the same (for example, state in which when one electronic component is a diode, the other electronic component is also a diode) and sizes, electrical characteristics, etc. are the same. The plurality of electronic components 3A to 3F is connected to the heat radiating structure 101 with substantially the same thermal conductivity coefficient. A state of being connected with substantially the same thermal conductivity coefficient means that thermal conductivity coefficients of members existing between the electronic components 3A to 3F and the heat radiating structure 101 are substantially the same.

The plurality of electronic components 3A to 3F is disposed to line up in the circumferential direction with reference to the anode connection portion 4. In this way, the plurality of electronic components 3A to 3F is disposed to surround the anode connection portion 4 in an arc shape. A state in which the plurality of electronic components lines up in the circumferential direction with respect to the anode connection portion 4 refers to a state in which the plurality of electronic components is arranged in a direction to draw an arc centered on the anode connection portion 4. For example, a reference line SL1 is set from the center point CP of the anode connection portion 4 with respect to a center position of one electronic component 3E. A reference line SL2 that is orthogonal to the reference line SL1 and passes through the center position of the electronic component 3E is set. In this instance, the electronic components 3D and 3F adjacent to the electronic component 3E are disposed at positions closer to the anode connection portion 4 than to the reference line SL2.

In the present embodiment, the plurality of electronic components 3A to 3F is arranged to draw an arc along the outer peripheral edge portion 8a of the first pattern 8 and the inner peripheral edge portion 9a of the second pattern 9. The plurality of electronic components 3A to 3F is disposed at a predetermined pitch along the margin portion 31 extending in the circumferential direction so as to be disposed on the margin portion 31. Note that the plurality of electronic components 3A to 3F may be disposed at equal pitches, may be disposed at different pitches from each other, or may be disposed so that some of the electronic components have equal pitches. In the example shown in FIG. 1, the electronic components 3A to 3C and the electronic components 3D to 3F are disposed at equal pitches, and only a pitch between the electronic component 3C and the electronic component 3D is different from the other pitches.

Each of the electronic components 3A to 3F has a current inflow terminal 3a electrically connected to the anode connection portion 4 and a current outflow terminal 3b electrically connected to the cathode connection portion 6. The inflow terminal 3a is connected to the first pattern 8 at a location near the outer peripheral edge portion 8a. The outflow terminal 3b is connected to the second pattern 9 at a location near the inner peripheral edge portion 9a. In this way, the electronic components 3A to 3F are disposed to straddle the margin portion 31 in the radial direction, and the inflow terminal 3a and the outflow terminal 3b are disposed to interpose the margin portion 31 therebetween.

A set of respective spatial distances L1 between the anode connection portion 4 and the inflow terminal 3a is defined as a first spatial distance group. A set of respective spatial distances L2 between the cathode connection portion 6 and the outflow terminal 3b is defined as a second spatial distance group. Here, the spatial distance L1 between the anode connection portion 4 and the inflow terminal 3a can be defined as a shortest distance three-dimensionally passing through a space between the anode connection portion 4 and the inflow terminal 3a. The spatial distance L2 between the cathode connection portion 6 and the outflow terminal 3b can be defined as a three-dimensional shortest distance between the cathode connection portion 6 and the outflow terminal 3b. Each component is disposed in a plane on the substrate 2. Therefore, distances in a plan view as illustrated in FIG. 1 are the spatial distances L1 and L2. In the present embodiment, the first spatial distance group has equal spatial distances L1 within the spatial distance group. That is, the spatial distance L1 at the inflow terminal 3a of the electronic component 3A is equal to the spatial distance L1 at the inflow terminal 3a of the electronic component 3B. Further, the spatial distance L1 at the inflow terminal 3a of the electronic component 3A is equal to the spatial distance L1 at the inflow terminal 3a of each of the other electronic components 3C to 3F. Note that in the present specification, a state in which the spatial distance L1 is "equal" not only means a case in which the dimensions are exactly the same, but also allows a shift due to a manufacturing error or a slight shift caused by the convenience of arrangement with other parts. For example, even when there is a difference between the spatial distance L1 for one electronic component and the spatial distance L1 for another electronic component, it is presumed that a case in which the difference is 10% or less of the total length of the spatial distance L1 is included in the "equal" state. Note that in the present embodiment, the spatial distances L2 of the electronic components 3A to 3F are different from each other.

Further, a set of respective thermal resistances between the anode connection portion 4 and the inflow terminal 3a is defined as a first thermal resistance group. A set of respective thermal resistances between the cathode connection portion 6 and the outflow terminal 3b is defined as a second thermal resistance group. Here, the thermal resistance between the anode connection portion 4 and the inflow terminal 3a can be defined as "power consumption of electronic component/ (temperature of inflow terminal−temperature of anode connection portion)". The thermal resistance between the cathode connection portion 6 and the outflow terminal 3b can be defined as "power consumption of electronic component/ (temperature of outflow terminal−temperature of cathode connection portion)". In the present embodiment, the first thermal resistance group has equal thermal resistances within the thermal resistance group. That is, the thermal resistance at the inflow terminal 3a of the electronic component 3A is equal to the thermal resistance at the inflow terminal 3a of the electronic component 3B. Further, the thermal resistance at the inflow terminal 3a of the electronic component 3A is equal to the thermal resistance at the inflow terminal 3a of each of the other electronic components 3C to 3F.

Further, a set of DC resistances of each pattern between the anode connection portion 4 and the inflow terminal 3a is defined as a first DC resistance group. A set of DC resistances of each pattern between the cathode connection portion 6 and the outflow terminal 3b is defined as a second DC resistance group. Note that the DC resistance is defined by a method generally used by those skilled in the art as a ratio of a DC voltage to a DC current according to Ohm's law, which is a basic law for a DC circuit. In the present embodiment, the first DC resistance group has equal DC resistances within the DC resistance group. That is, the DC resistance in the pattern of the inflow terminal 3a of the electronic component 3A is equal to the DC resistance in the pattern of the inflow terminal 3a of the electronic component 3B. Further, the DC resistance in the pattern of the inflow terminal 3a of the electronic component 3A is equal to the DC resistance in the pattern of the inflow terminal 3a of each of the other electronic components 3C to 3F.

Further, a set of impedances of each pattern between the anode connection portion 4 and the inflow terminal 3a is defined as a first impedance group. A set of impedances of each pattern between the cathode connection portion 6 and the outflow terminal 3b is defined as a second impedance group. Note that impedance is a ratio of a voltage to a current vector-displayed in an AC circuit, and is defined by a method generally used by those skilled in the art. In the present embodiment, the first impedance group has equal impedances within the impedance group. That is, the impedance in the pattern of the inflow terminal 3a of the electronic component 3A is equal to the impedance in the pattern of the inflow terminal 3a of the electronic component 3B. Further, the impedance in the pattern of the inflow terminal 3a of the electronic component 3A is equal to the impedance in the pattern of the inflow terminal 3a of each of the other electronic components 3C to 3F.

As described above, note that in the present embodiment, the spatial distances L2 of the electronic components 3A to 3F are different from each other. On the other hand, on the cathode connection portion 6 side, a structure for reducing variations in respective electrical characteristics (thermal resistance, DC resistance, impedance, inductance, etc.) between the cathode connection portion 6 and the electronic components 3A to 3F is provided. The structure will be described with reference to FIG. 3.

Figure 3A:
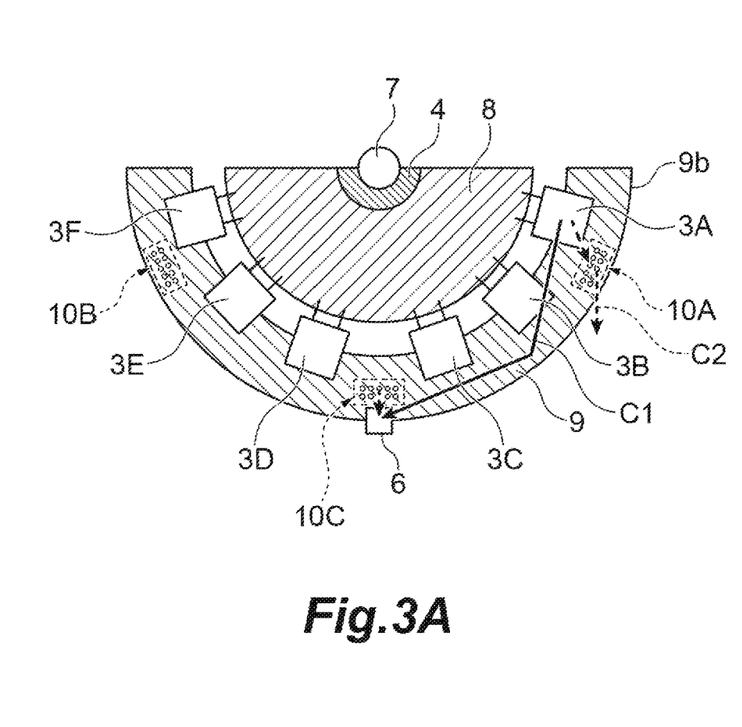
FIG. 3 is a diagram for description of a current path between an electronic component 3A and a cathode connection portion.
Figure 3B:
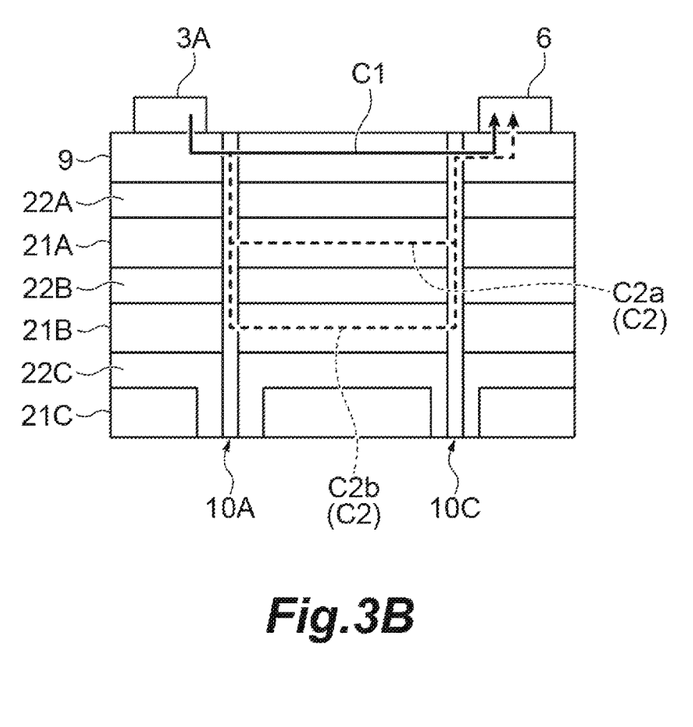

First, as illustrated in FIG. 3(b), the second pattern 9 is provided with stacked patterns 21A, 21B, and 21C in a stacking direction toward the inside of the substrate 2. The stacking direction is a thickness direction of the substrate 2. The stacked patterns 21A, 21B, and 21C include conductive members. It is desirable that the stacked patterns 21A, 21B, and 21C have the same shape as that of the second pattern 9 when viewed in the stacking direction (that is, in a plan view). An insulating layer 22A is interposed between the second pattern 9 and the stacked pattern 21A. An insulating layer 22B is interposed between the stacked pattern 21A and the stacked pattern 21B. An insulating layer 22C is interposed between the stacked pattern 21B and the stacked pattern 21C.

As illustrated in FIG. 3(a), through-hole conductors 10A, 10B, and 10C are formed in the second pattern 9. The through-hole conductors 10A, 10B, and 10C are conductors extending in the stacking direction, and electrically connect the second pattern 9 and the stacked patterns 21A and 21B. Note that a plurality of through-hole conductors 10A may be formed in a dense state within a partial region (rectangular region indicated by a broken line in FIG. 3A). This description is similarly applied to the through-hole conductors 10B and 10C.

The through-hole conductor 10C (first through-hole conductor) is formed at a position close to the cathode connection portion 6 in the second pattern 9. The through-hole conductor 10C is formed at a position close to the cathode connection portion 6, that is, at a position between the electronic component 3C and the electronic component 3D in the circumferential direction. Further, in the second pattern 9, the through-hole conductors 10A and 10B (second through-hole conductors) are formed at positions separated from the through-hole conductor 10C in the circumferential direction. The through-hole conductor 10A is formed at a position between the electronic component 3A and the electronic component 3B in the circumferential direction. Of the positions, the through-hole conductor 10A is formed at a position close to the electronic component 3A. The through-hole conductor 10B is formed at a position between the electronic component 3F and the electronic component 3E in the circumferential direction. Of the positions, the through-hole conductor 10B is formed at a position close to the electronic component 3F. The through-hole conductors 10A, 10B, and 10C are disposed at positions close to the outer peripheral edge portion 9b of the second pattern 9 in the radial direction.

In the case of the above configuration, a path of a current flowing from each of the electronic component 3A to 3F to the cathode connection portion 6 is formed not only in the second pattern 9, but also in the through-hole conductors 10A, 10B, and 10C, and the stacked patterns 21A and 21B.

First, a current from the electronic component 3A to the second pattern 9 will be described with reference to FIG. 3. A part of the current from the electronic component 3A flows to the cathode connection portion 6 through the current path C1 of the second pattern 9. On the other hand, a part of the current from the electronic component 3A flows to the cathode connection portion 6 through the current path C2 toward an inner layer via the through-hole conductors 10A and 10C. The current flowing through the current path C2 passes through the second pattern 9 from the electronic component 3A and is headed to the through-hole conductor 10A. In the inner layer, the current flowing through the current path C2 flows in the order of the through-hole conductor 10A, the stacked patterns 21A and 21B, and the through-hole conductor 10C. Then, the current flowing through the current path C2 flows from the through-hole conductor 10C through the second pattern 9 to the cathode connection portion 6. In the inner layer, the current path C2 branches into a current path C2a passing through the stacked pattern 21A and a current path C2b passing through the stacked pattern 21B.

Figure 4A:
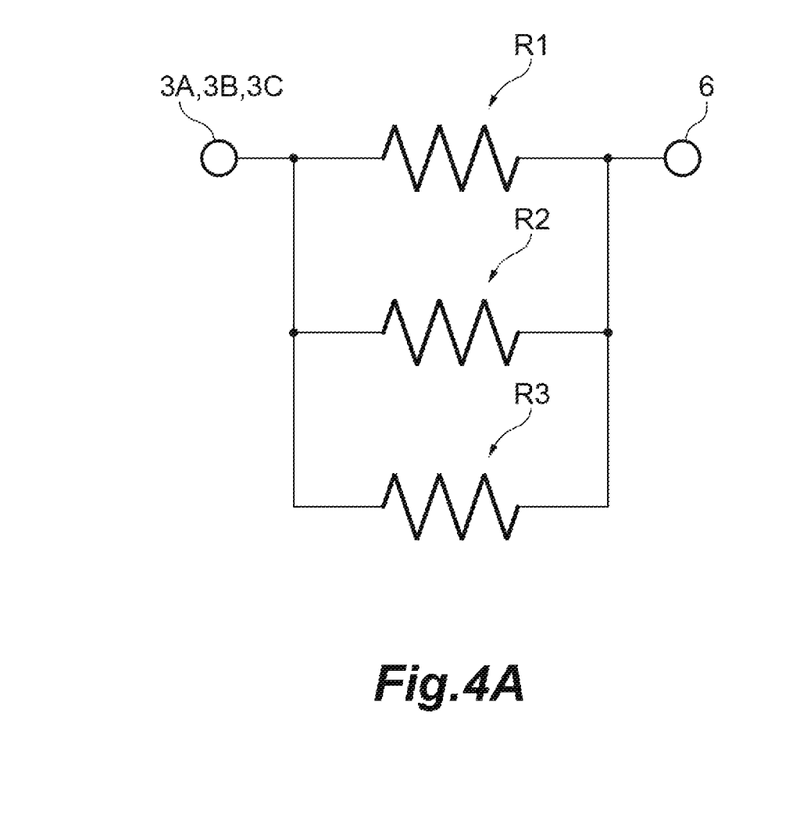
FIG. 4 is a diagram for description of wiring resistance.
Figure 4B:
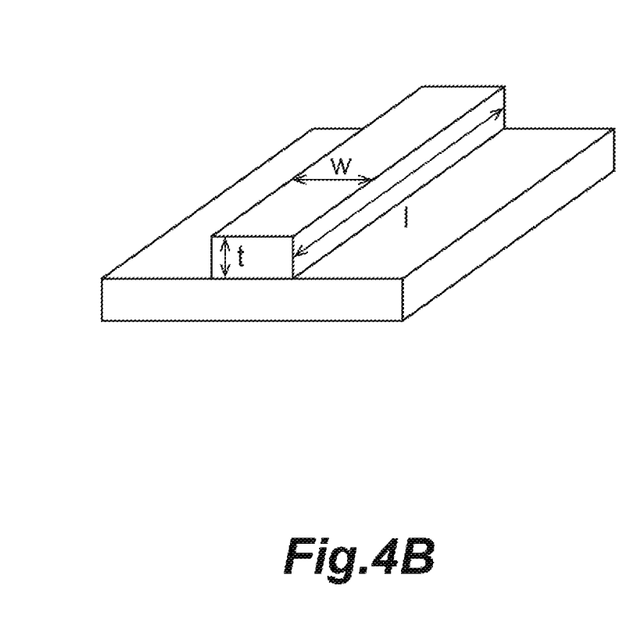

Here, FIG. 4(a) is a schematic view of a wiring resistance R1 for a current passing through the current path C1, a wiring resistance R2 for a current passing through the current path C2a, and a wiring resistance R3 for a current passing through the current path C2b. In this case, the wiring resistances R1, R2, and R3 are connected in parallel between the electronic component 3A and the cathode connection portion 6. Here, as illustrated in FIG. 4(b), a relationship of "$R = \rho \times (l/tw)$" is satisfied between a length "l", a thickness "t", and a width "w" of a wiring and a wiring resistance R.

That is, as the wiring length increases, the wiring resistance R increases, and as the wiring thickness decreases, the wiring resistance R increases. The electronic component 3A is the furthest away from the cathode connection portion 6. Therefore, the current path C1 from the electronic component 3A to the cathode connection portion 6 illustrated in FIG. 3 is in a state of being long and thick. In this state, the wiring resistance R1 is set to "1Ω", and the wiring resistances R2 and R3 are set to "1.2Ω". A composite resistance at this time can be regarded as "0.375Ω".

Figure 5A:
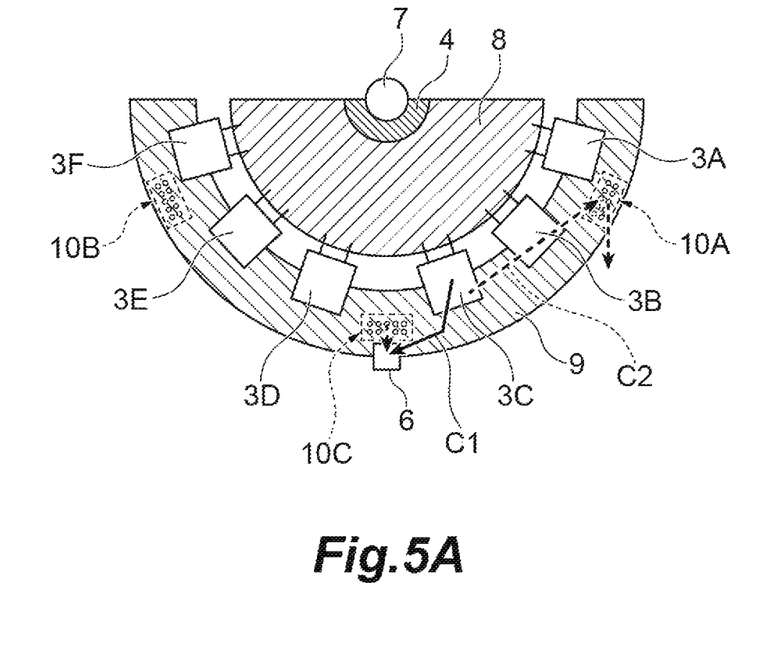
FIG. 5 is a diagram for description of a current path between an electronic component 3C and the cathode connection portion.
Figure 5B:
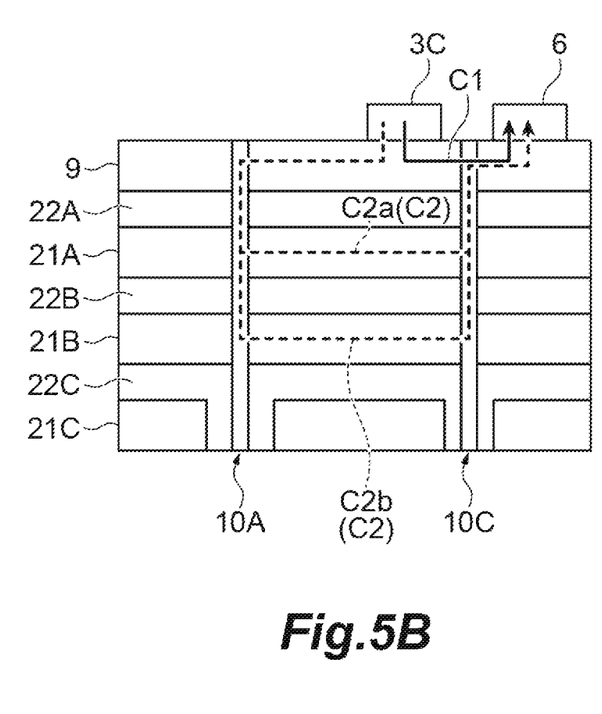

Next, a current from the electronic component 3C toward the second pattern 9 will be described with reference to FIG. 5. Since the electronic component 3C is closest to the cathode connection portion 6, the current path C1 is short. On the other hand, in the current path C2, a distance from the electronic component 3C to the through-hole conductor 10A becomes long. In this case, the current path C1 from the electronic component 3C to the cathode connection portion 6 illustrated in FIG. 5 is short in length and thin in thickness. By shortening the length of the current path C1, the wiring resistance R1 becomes "0.5Ω", which is lower than that of the example of FIG. 3. On the other hand, as the current path C2 becomes longer, the wiring resistances R2 and R3 become "3Ω", which is higher than that of the example of FIG. 3. A composite resistance at this time can be regarded as "0.375Ω".

Figure 6A:
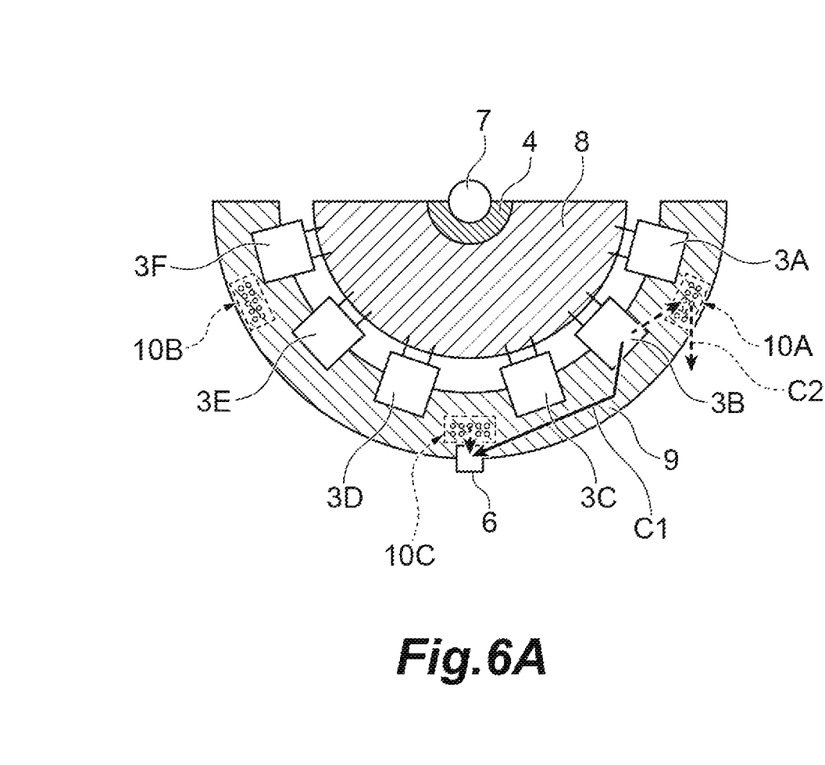
FIG. 6 is a diagram for description of a current path between an electronic component 3B and the cathode connection portion.
Figure 6B:
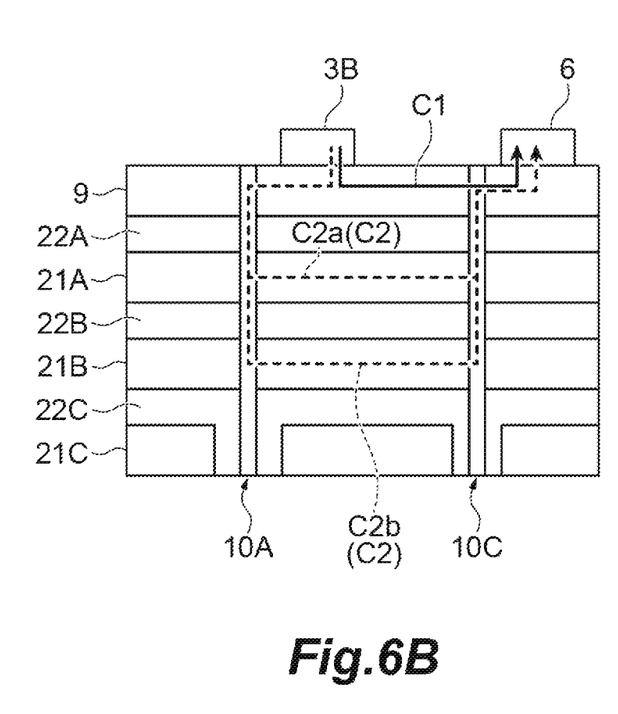

Next, a current from the electronic component 3B to the second pattern 9 will be described with reference to FIG. 6. Since the electronic component 3B has a middle distance with respect to the cathode connection portion 6, the current path C1 is shorter than the electronic component 3A and longer than the electronic component 3C. On the other hand, in the current path C2, a distance from the electronic component 3B toward the through-hole conductor 10A becomes a middle length of the electronic components 3A and 3C. In this case, the length and thickness of the current path C1 from the electronic component 3B to the cathode connection portion 6 illustrated in FIG. 6 are in a middle state of the electronic components 3A and 3C. Since the length of the current path C1 is a middle length, the wiring resistance R1 becomes "0.6Ω", which is a middle value of the examples of FIGS. 3 and 5. On the other hand, when the current path C2 becomes a middle path, the wiring resistances R2 and R3 become "2Ω", which is a middle value of the examples of FIGS. 3 and 5. A composite resistance at this time can be regarded as "0.375Ω". As described above, all the composite resistances between the electronic components 3A, 3B, and 3C and the cathode connection portion 6 can be regarded as "0.375Ω". Note that the same relationship holds for the electronic components 3D, 3E, and 3F.

Figure 7A:
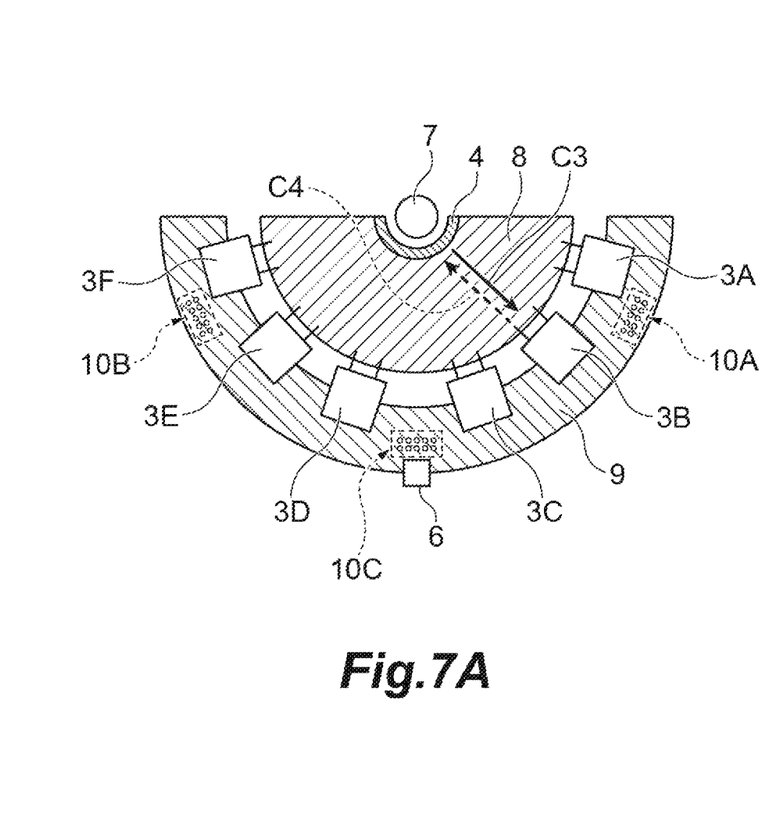
FIG. 7 is a diagram for description of cancellation of magnetic flux.
Figure 7B:
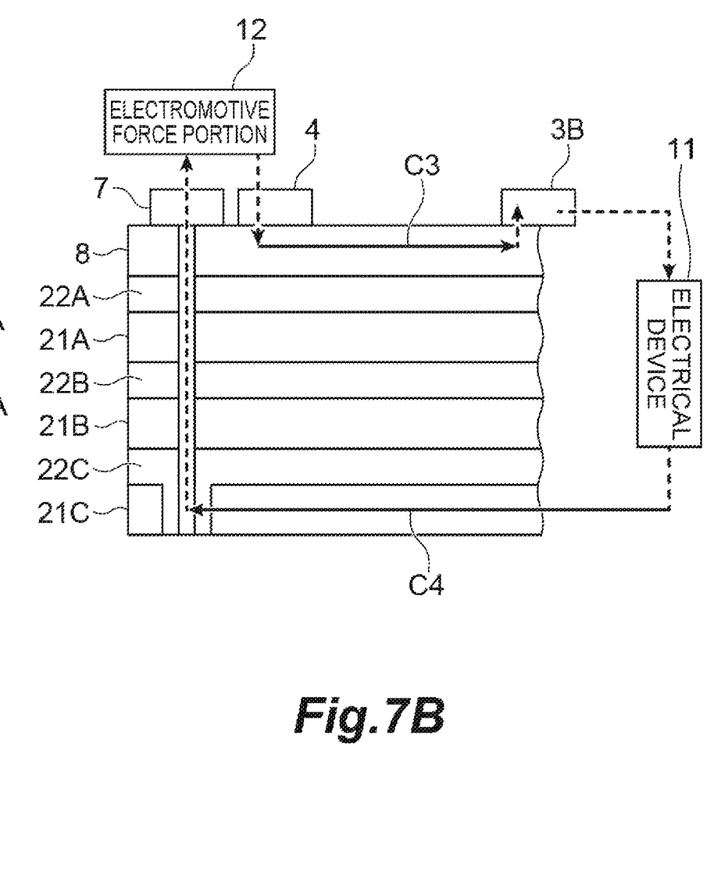

As illustrated in FIG. 7, a current from the anode connection portion 4 flows through a current path C3 toward the electronic component 3B via the first pattern 8. On the other hand, a current from the electronic component 3B toward the electrical device 11 flows through a current path C4 in the stacked pattern 21C via the ground 15 (see FIG. 2). Then, the current is headed to the electromotive force portion 12 via the ground terminal 7. In this instance, the current flowing through the current path C3 of the first pattern 8 and the current flowing through the current path C4 of the stacked pattern 21C are in a relationship of mutually canceling magnetic flux. In this way, the electronic component mounting structure 1 can obtain the effect of reducing the magnetic flux in the structure.

Next, a description will be given of an operation and effect of the electronic component mounting structure 1 according to the present embodiment.

In the electronic component mounting structure 1, the first spatial distance group has equal spatial distances L1 within the spatial distance group. The first spatial distance group includes spatial distances between the anode connection portion 4 and the inflow terminals 3a. With such a configuration, the spatial distances L1 of the inflow terminals 3a of the respective electronic components 3A to 3F with respect to the anode connection portion 4 can be made equal. In this case, it is possible to equalize the wiring inductance between the anode connection portion 4 and the inflow terminal 3a among the plurality of electronic components 3A to 3F. From the above description, it is possible to attempt equalization of the component heat generation for each electronic component and the current value among the plurality of electronic components.

The electronic component group 3 includes the plurality of electronic components 3A to 3F having the same standard. Since the electronic components 3A to 3F have the same standard, the effect of equalization of the component heat generation for each electronic component and the current value by adopting the above configuration becomes more remarkable.

The first thermal resistance group has equal thermal resistances within the thermal resistance group. The first thermal resistance group includes thermal resistances between the anode connection portion 4 and the inflow terminals 3a. In this case, it is possible to equalize the thermal resistance among the plurality of electronic components.

The first DC resistance group has equal DC resistances in the DC resistance group. The first DC resistance group includes DC resistances of patterns between the anode connection portion 4 and the inflow terminals 3a. In this case, it is possible to attempt equalization of the DC resistance among the plurality of electronic components.

The first impedance group has equal impedances within the impedance group. The first impedance group includes impedances of patterns between the anode connection portion 4 and the inflow terminals 3a. In this case, it is possible to attempt equalization of the impedance among the plurality of electronic components.

In the electronic component mounting structure 1, the plurality of electronic components 3A to 3F is disposed to line up in the circumferential direction with reference to the anode connection portion 4. With such a configuration, it is possible to equalize the spatial distance L1 of each of the electronic components 3A to 3F with respect to the anode connection portion 4. In this case, it is possible to attempt equalization of the wiring inductance between the anode connection portion 4 and the electronic components 3A to 3F among the plurality of electronic components 3A to 3F. From the above description, it is possible to attempt equalization of the wiring inductance among the plurality of electronic components.

The pattern 5 has the first pattern 8 on the inner peripheral side electrically connected to the anode connection portion 4, and the second pattern 9 on the outer peripheral side electrically connected to the cathode connection portion 6. The stacked patterns 21A and 21B stacked in the stacking direction with respect to the second pattern 9 are provided, the through-hole conductor 10C electrically connecting the second pattern 9 and the stacked patterns 21A and 21B is formed at a position near the cathode connection portion 6, and the through-hole conductors 10A and 10B are formed at positions separated from the through-hole conductor 10C in the circumferential direction. In this case, the current from the electronic components 3A to 3F toward the cathode connection portion 6 passes through not only the current path C1 of the second pattern 9, but also the current path C2 passing through the through-hole conductors 10A and 10B, the stacked patterns 21A and 21B, and the through-hole conductor 10C. In this case, it is possible to equalize the wiring inductance between the electronic components with respect to the cathode connection portion.

The present disclosure is not limited to the embodiment described above.

For example, a relationship between the current inflow port and the current outflow port may be the reverse of the above-described embodiment. That is, the inflow port may be provided on the outer peripheral side and the outflow port may be provided on the center side. In this case, the spatial distance L1 is the spatial distance of the second spatial distance group.

Further, the number of electronic components, etc. are not particularly limited, and the shape of each pattern, etc. is not particularly limited.

Figure 8A:
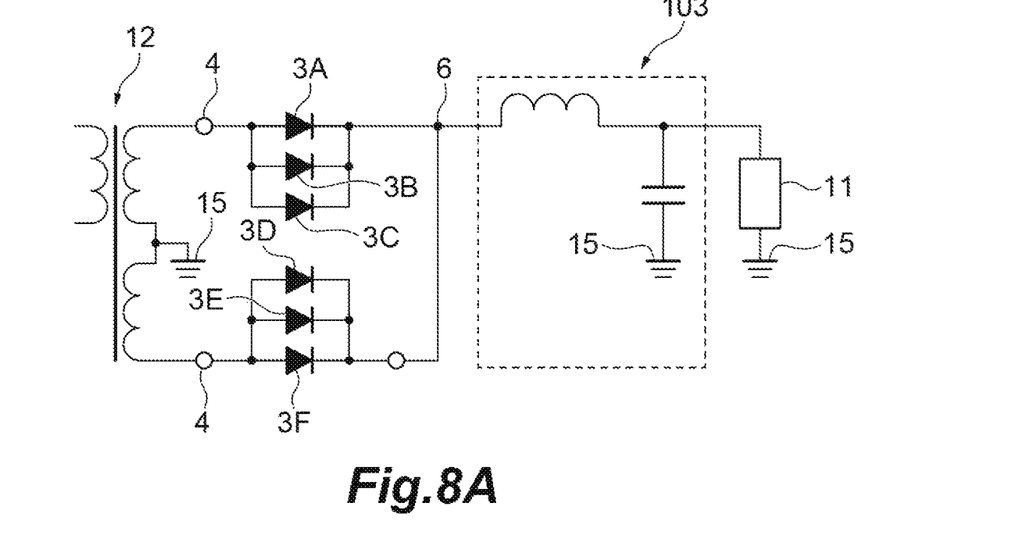
FIG. 8 is a diagram illustrating an electronic component mounting structure according to a modification.
Figure 8B:
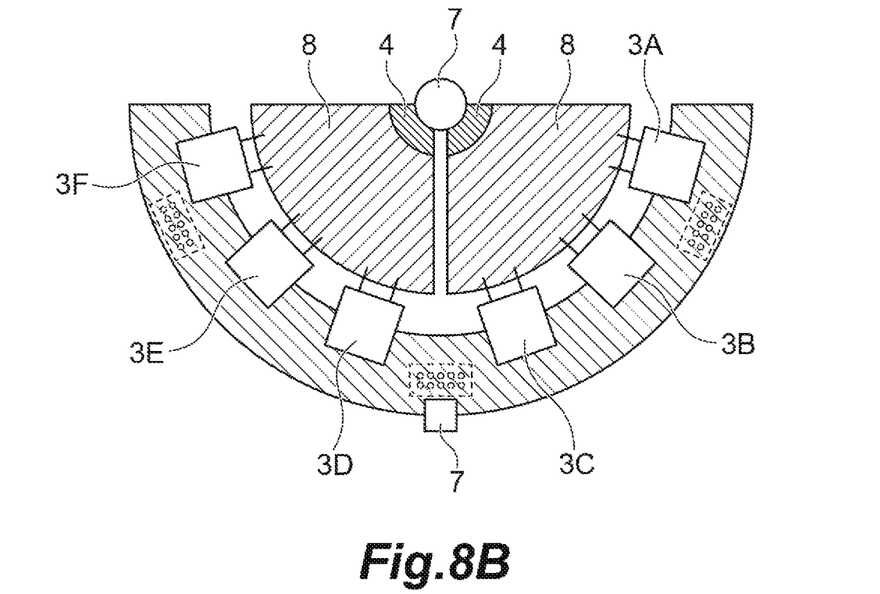

For example, as illustrated in FIG. 8, the first pattern 8 may be divided at the center, and the electronic components 3A to 3C and the electronic components 3D to 3F may be different parallel circuits. FIG. 8 illustrates a switching DC/DC converter to which the electronic component mounting structure of the present disclosure is applied. The cathode connection portion 6 is connected to a smoothing inductor DC/DC converter 103. Further, as the electromotive force portion 12, a transformer of an isolated switching DC/DC converter is adopted. Rectifying diodes are used as the electronic components 3A to 3F at this time.

REFERENCE SIGNS LIST

1: electronic component mounting structure, 2: substrate, 3: electronic component group, 3A to 3F: electronic component, 4: anode connection portion (inflow port), 6: cathode connection portion (outflow port), 8: first pattern, 9: second pattern, 10A, 10B: through-hole conductor (second through-hole conductor), 10C: through-hole conductor (first through-hole conductor), 21A, 21B: stacked pattern.

The invention claimed is:

1. An electronic component mounting structure in which an electronic component group is mounted on a substrate,
wherein the substrate has a current inflow port and a current outflow port, and a pattern constituting a part of a current path between the inflow port and the outflow port,
the electronic component group includes a plurality of electronic components connected between the inflow port and the outflow port,
each of the electronic components has a current inflow terminal electrically connected to the inflow port and a current outflow terminal electrically connected to the outflow port, and
one of a first spatial distance group and a second spatial distance group has equal spatial distances within the one spatial distance group,
the first spatial distance group includes spatial distances between the inflow port and the inflow terminals,
the second spatial distance group includes spatial distances between the outflow port and the outflow terminals.

2. The electronic component mounting structure according to claim 1, wherein the electronic component group includes the plurality of electronic components having the same standard.

3. The electronic component mounting structure according to claim 1,
wherein one of a first thermal resistance group and a second thermal resistance group has equal thermal resistance within the one thermal resistance group,
the first thermal resistance group includes thermal resistances between the inflow port and the inflow terminals,
the second thermal resistance group includes thermal resistances between the outflow port and the outflow terminals.

4. The electronic component mounting structure according to claim 1,
wherein one of a first DC resistance group and a second DC resistance group has equal DC resistances within the one DC resistance group,
the first DC resistance group includes DC resistances of patterns between the inflow port and the inflow terminals,
the second DC resistance group includes DC resistances of patterns between the outflow port and the outflow terminals.

5. The electronic component mounting structure according to claim 1,
wherein one of a first impedance group and a second impedance group has equal impedances within the one impedance group,
the first impedance group includes impedances of patterns between the inflow port and the inflow terminals,
the second impedance group includes impedances of patterns between the outflow port and the outflow terminals.

6. An electronic component mounting structure in which an electronic component group is mounted on a substrate, wherein the substrate has a current inflow port and a current outflow port, and a pattern constituting a part of a current path between the inflow port and the outflow port,
the electronic component group includes a plurality of electronic components connected between the inflow port and the outflow port,
each of the electronic components has a current inflow terminal electrically connected to the inflow port and a current outflow terminal electrically connected to the outflow port, and
the plurality of electronic components is disposed to line up in a circumferential direction with reference to one of the inflow port and the outflow port.

7. The electronic component mounting structure according to claim 6,
wherein the pattern has
a first pattern on an inner peripheral side electrically connected to one of the inflow port and the outflow port, and
a second pattern on an outer peripheral side electrically connected to the other one of the inflow port and the outflow port,
a stacked pattern stacked in a stacking direction with respect to the second pattern is provided, and
a first through-hole conductor electrically connecting the second pattern and the stacked pattern is formed at a position close to the other one of the inflow port and the outflow port, and a second through-hole conductor is formed at a position separated from the first through-hole conductor in a circumferential direction.

* * * * *